(12) United States Patent
Chang et al.

(10) Patent No.: US 7,722,082 B2
(45) Date of Patent: May 25, 2010

(54) SYSTEM AND METHOD FOR INSERTING NUMERIC LABELS AUTOMATICALLY

(75) Inventors: Chih-Kuang Chang, Taipei Hsien (TW); Xin-Yuan Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 604 days.

(21) Appl. No.: 11/608,797

(22) Filed: Dec. 9, 2006

(65) Prior Publication Data

US 2007/0139663 A1    Jun. 21, 2007

(30) Foreign Application Priority Data

Dec. 20, 2005    (CN) .................. 2005 1 012124.3

(51) Int. Cl.
*B42F 21/00* (2006.01)
*B42D 15/00* (2006.01)
*B42D 15/10* (2006.01)
*G09C 3/00* (2006.01)
*G06F 7/00* (2006.01)
*G06F 17/00* (2006.01)
*G09G 5/00* (2006.01)

(52) U.S. Cl. .................. 283/36; 283/37; 283/41; 283/70; 283/74; 283/117; 707/102; 345/418; 345/619

(58) Field of Classification Search .............. 281/51; 283/67, 117; 345/418, 619; 375/E7.081, 375/E7.265; 382/232; 434/365; 700/96, 700/103; 705/400; 707/10, 101, 102, 104.1; 715/853; G06F 17/00, 17/24; G06T 9/00; H04N 1/41, H04N 7/26, 7/34
See application file for complete search history.

(56) References Cited

U.S. PATENT DOCUMENTS 6,481,572 B2    11/2002    Wein et al.
6,766,331 B2 *    7/2004    Shema et al. ............... 707/102
2004/0109609 A1 *    6/2004    Mossakowski ............... 382/232

* cited by examiner

*Primary Examiner*—Dana Ross
*Assistant Examiner*—Justin V Lewis
(74) *Attorney, Agent, or Firm*—Wei Te Chung

(57) ABSTRACT

A system for inserting numeric labels automatically includes: a setting module (10) configured for setting label properties of inserting numeric labels to define a numeric labels configuration; an input/output module (12) configured for reading the label properties, importing a technical drawing file to be inserted with the numeric labels; a selecting module (14) configured for extracting an array of references to be inserted with the numeric label from the technical drawing file; and a labeling module (16) configured for labeling the references in the array of references with numeric labels correspondingly according to the numeric labels configuration. A related method is also disclosed.

11 Claims, 4 Drawing Sheets

SYSTEM AND METHOD FOR INSERTING NUMERIC LABELS AUTOMATICALLY

BACKGROUND OF THE INVENTION

1. Field of the Invention

The present invention relates to a system and method for inserting numeric labels automatically.

2. General Background of the Invention

Generally, a user needs to manually sequence numeric labels on a product technical drawing file. Labeling in the technical drawing file refers to sequentially inserting numeric labels to connected areas on each measurement location. In the technical drawing file, each measurement location is respectively inserted with unique numeric labels 1, 2, 3 . . . etc.

At present, the user has to manually label the above-mentioned numeric labels and draw a round frame in order to circle the numeric label near the measurement information such as the size or position of an reference in a technical drawing file. The round frame and the numeric label form a label entity, for example: ①②③④⑤⑥⑦⑧⑨⑩ . . . etc.

However, the manually labeling cannot precisely control a labeling order, and is time-consuming and cumbersome. Therefore, the present invention reduces time required for inserting numeric labels on the measurement locations in a technical drawing file. And, the present invention is very precisely control the labeling order.

SUMMARY

A system for inserting numeric labels automatically includes: a setting module configured for setting label properties of inserting numeric labels to define numeric labels configuration; an input/output module configured for reading the label properties, importing a technical drawing file to be inserted with the numeric labels; a selecting module configured for extracting an array of references to be inserted with the numeric label from the technical drawing file; and a labeling module configured for labeling the references in the array of references with numeric labels correspondingly according to the numeric labels configuration.

A computer-based method for inserting numeric labels automatically includes the steps of: setting label properties of inserting numeric labels to define a numeric labels configuration; reading the label properties, and importing a technical drawing file to be inserted with numeric labels; extracting an array of references to be inserted with numeric labels from the technical drawing file; obtaining the numeric labels configuration or creating a new numeric label configuration; and labeling the references in the array of references with numeric labels correspondingly according to the numeric labels configuration.

Other advantages and novel features of the present invention will become more apparent from the following detailed description of preferred embodiments when taken in conjunction with the accompanying technical drawings.

BRIEF DESCRIPTION OF THE TECHNICAL DRAWINGS

DETAILED DESCRIPTION OF THE INVENTION

Figure 1:
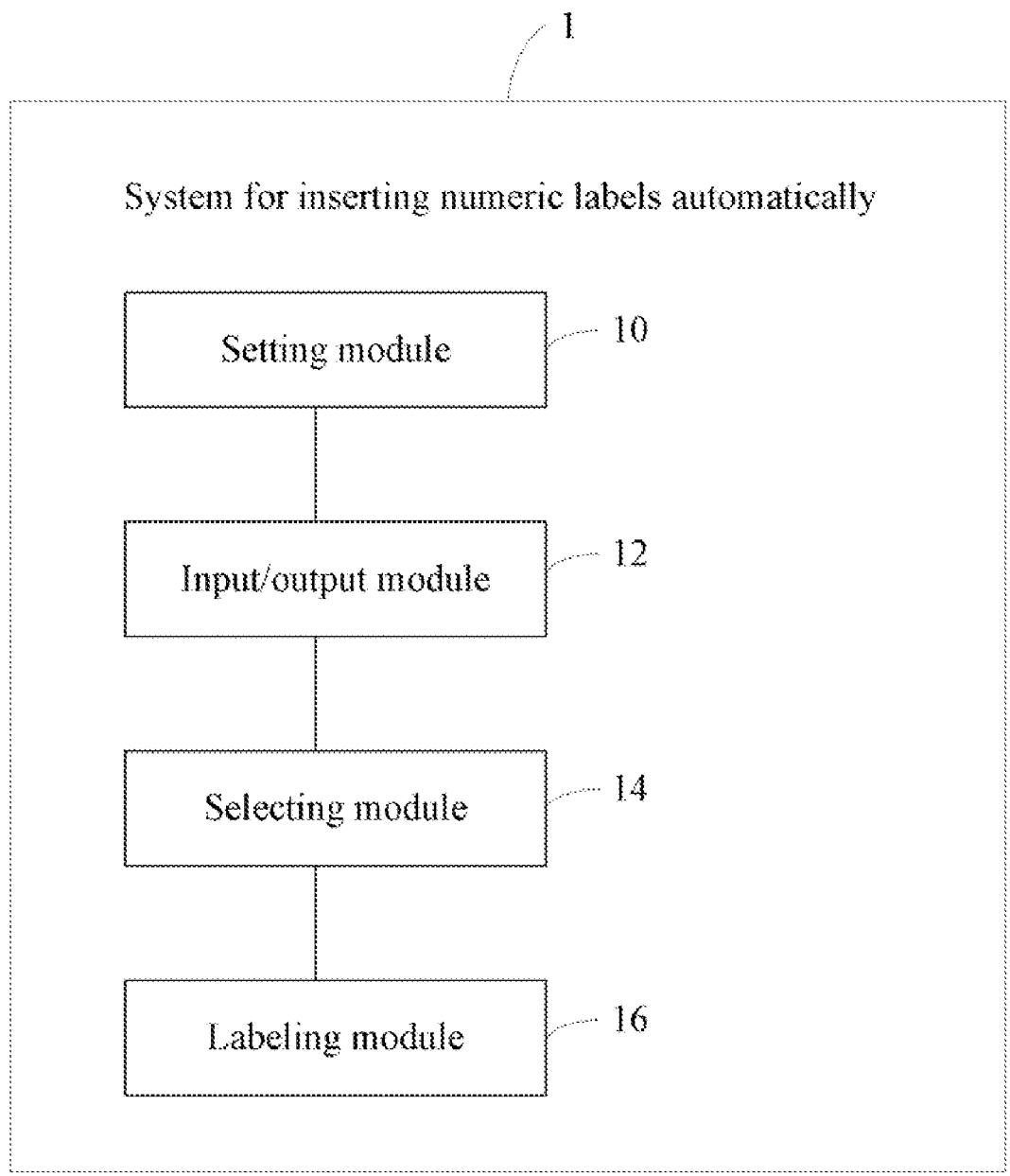
FIG. 1 is a schematic diagram of function modules of a system for inserting numeric labels in accordance with one preferred embodiment.

FIG. 1 is a schematic diagram of function modules of a system for inserting numeric labels in accordance with one preferred embodiment. The system typically runs on a computer (not shown), the computer may be a personal computer (PC).

In this preferred embodiment, the system mainly includes a setting module 10, an input/output module 12, a selecting module 14, and a labeling module 16.

The setting module 10 is configured for inputting/setting/configuring label properties of the numeric labels through the computer, thereby yielding a numeric labels configuration. The label properties include, but not limited to: a font size of the numeric labels, a font of the numeric labels, a color of the numeric labels, a label numerical variable, a size of the numeric labels, a color of a border of the numeric labels, and a shape of the border.

The setting module 10 is further configured for setting a starting numerical value of the numeric labels, a Y-partition value, a top margin between a reference to be inserted the numeric label and the numeric label of the reference, and a left margin between the reference and the numeric label of the reference. The top margin and the left margin of the reference determine a location to insert the numeric label corresponding to the reference.

The input/output module 12 is configured for reading the label properties, importing a technical drawing file to be inserted with the numeric labels. The technical drawing file is a CAD system (e.g. Pro/E, I-DEAS, Parasolid, AutoCAD, VPS, or the like) readable file that contains 2-Dimensional and/or 3-Dimensional data. In the preferred embodiment, the CAD system used is the AutoCAD system. The input/output module 12 is further configured for checking whether the technical drawing file has at least two references to be inserted with the numeric labels and checking whether data of each of the references to be inserted with the numeric labels is formatted as defined by AutoCAD. In the preferred embodiment, the references refer to dimensions. For example, the technical drawing file data contains data representing a plurality of circles rectangles, each of the circles has a diameter value, each of the rectangles has a length value and a width value, the diameter value, the length value and the width value measured are the references to be inserted with the numeric labels. The attributes of each of the references include: an x-coordinate value, a y-coordinate value, and an identification N.

The input/output module 12 is further configured for obtaining the numeric labels configuration or creating a new numeric labels configuration if a desired numeric labels configuration is not obtained, and also for outputting results after inserting the numeric labels.

The input/output module 12 is further configured for reading and assigning the starting numerical value of the numeric labels as an initial value of the label numerical variable.

The input/output module 12 is further configured for applying the numeric labels configuration to the location that will be inserted with the numeric label corresponding to the reference. The location is determined by the top margin and the left margin of the reference.

The selecting module 14 is configured for extracting references to be inserted with the numeric labels from the technical drawing file according to the attributes of the references as defined by AutoCAD, and inputting the references into an array of references. In the array of references, each of the references has the identification N, the x-coordinate value, and the y-coordinate value.

The labeling module 16 is configured for automatically labeling the references in the array of references with numeric labels correspondingly.

Figure 2:
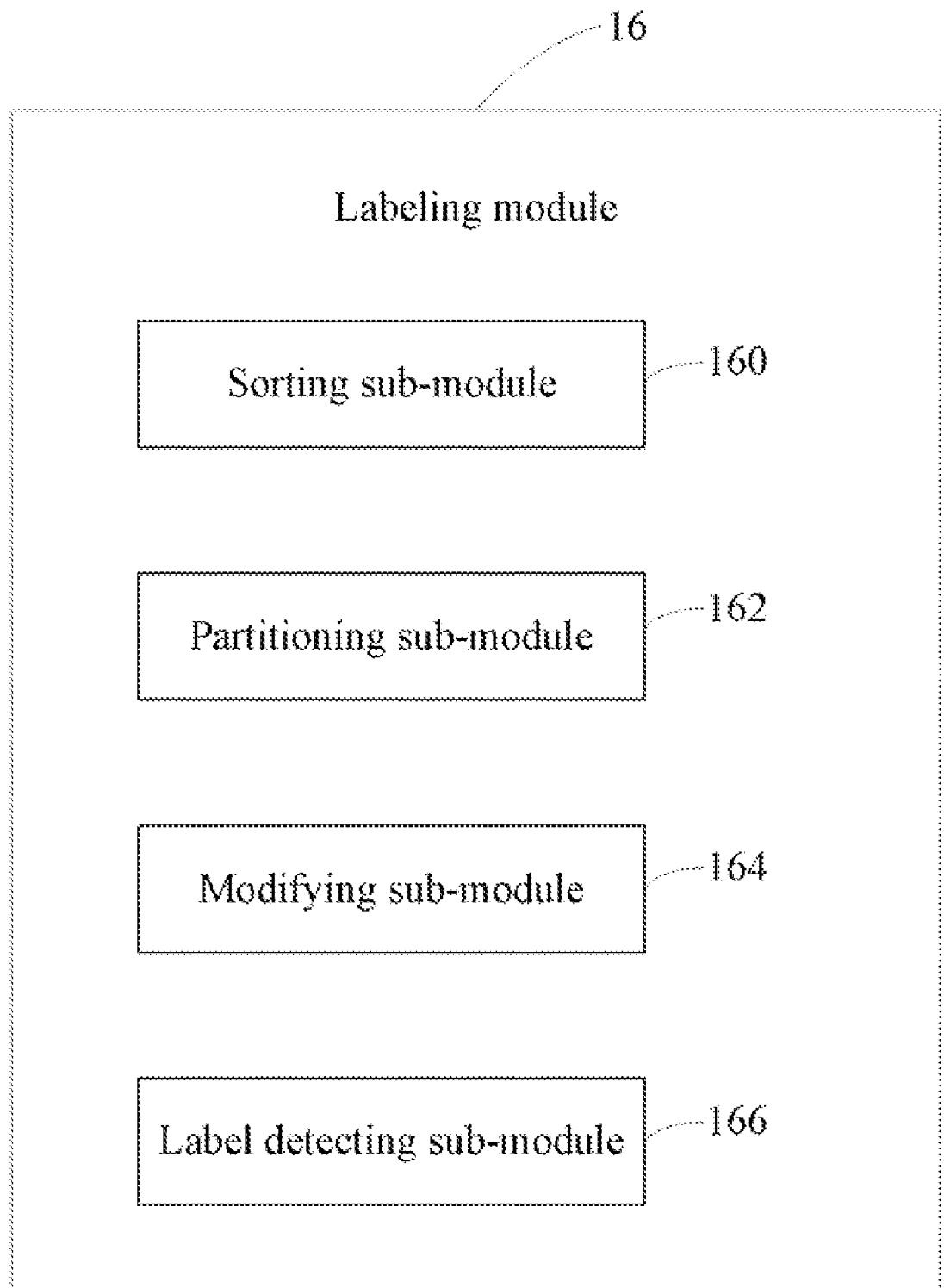
FIG. 2 is a schematic diagram of function sub-modules of a labeling module in FIG. 1.

FIG. 2 is a schematic diagram of function sub-modules of a labeling module. The labeling module 16 includes: a sorting sub-module 160, a partitioning sub-module 162, a modifying sub-module 164, and a label detecting sub-module 166.

The sorting sub-module 160 is configured for sorting the array of references in descending order according to the y-coordinate value of each reference, thereby yielding a sorted array.

The partitioning sub-module 162 is configured for splitting the sorted array into a plurality of sub-arrays according to the y-coordinates of the references. The number of sub-arrays equals to the Y-partition value. Each of the sub-arrays would represent a range of the y-coordinates. In the preferred embodiment, each of the sub-arrays would have an equal range size. Each sub-array would contain the reference whose y-coordinate lies in the range represented by the sub-array correspondingly. For example, if a highest y-coordinate value of a reference in the example array is 41, the lowest y-coordinate value of a reference in the example array is 11, and the Y-partition value is 3, the partitioning sub-module 162 would split the example array into 3 sub-arrays, a first example sub-array representing the range of [31, 41]; a second example sub-array representing the range of [21,31); and a third example sub-array representing the range of [11, 21).

The sorting sub-module 160 is further configured for sorting the references in the sub-arrays in either of a first order and a second order according to the x-coordinate value of each of the references such that no two sub-arrays representing adjacent ranges have the same order. In the preferred embodiment, the first order is an ascending order and the second order is the descending order. Using the previous example, if the first example sub-array is sorted in the ascending order, then the second example sub-array is sorted in the descending order, and the third example sub-array would be sorted in the ascending order.

The modifying sub-module 164 is configured for incrementing or decrementing the label numerical variable automatically.

The label detecting sub-module 166 is configured for detecting whether all the references to be inserted with the numeric labels corresponding to the sorted sub-arrays of references have been labeled.

Figure 3:
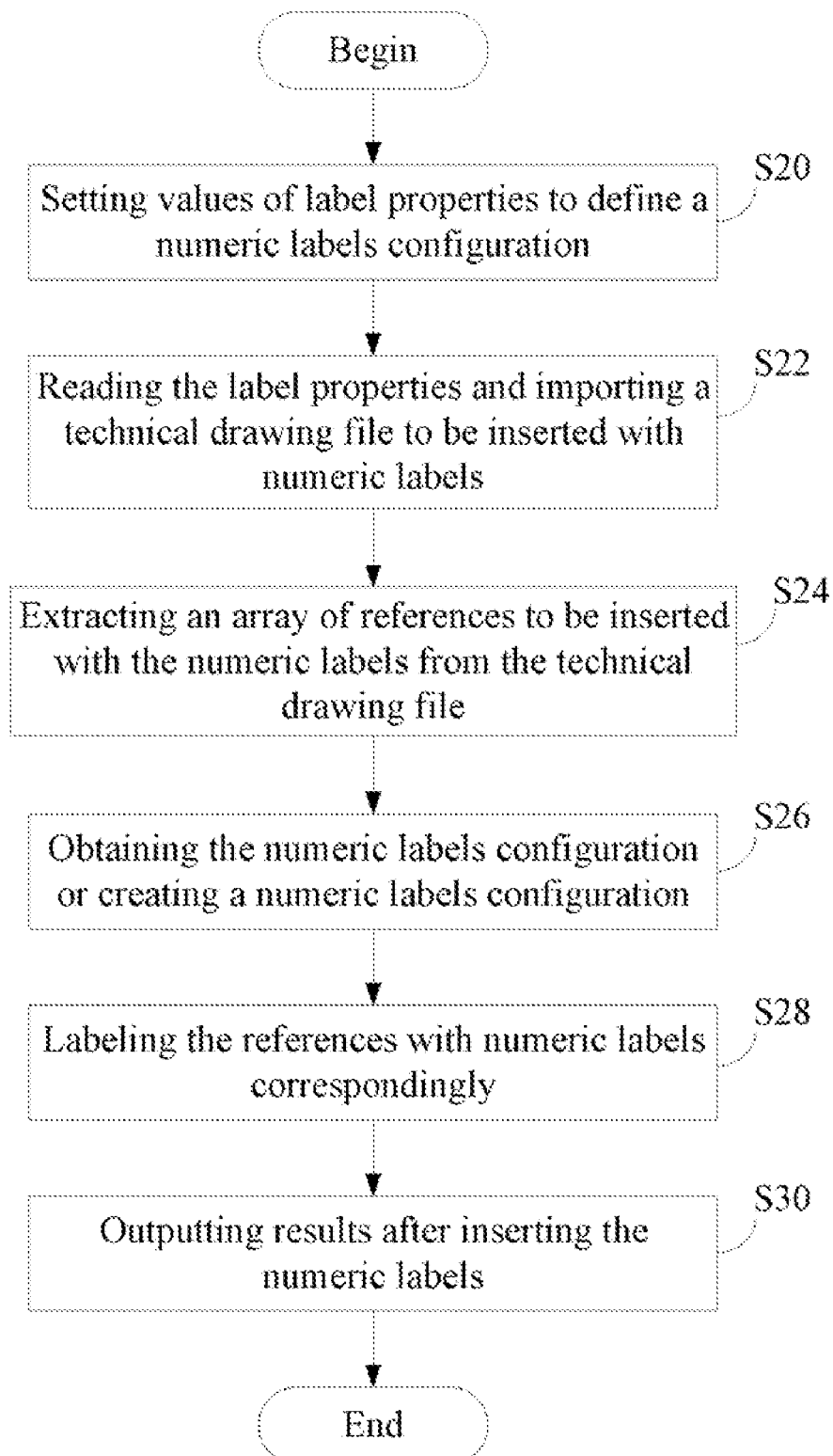
FIG. 3 is a flowchart of a preferred method for inserting numeric labels in accordance with a preferred embodiment.

FIG. 3 is a flowchart of a preferred method for inserting numeric labels in accordance with a preferred embodiment. In step S20, the label properties of the numeric labels are inputted/set/configured through the computer so as to define the numeric labels configuration. The label properties include, but not limited to: the font size of the numeric labels, the font of the numeric labels, the color of the numeric labels, the label numerical variable, the size of the numeric labels, the color of the border of the numeric labels, the shape of the border. For example, the numeric labels configuration may be: setting the font size of the numeric labels to 6, setting the font of the numeric labels as times new roman, setting the color of the numeric labels to be red, setting the value of the label numerical variable to 5, setting the size of the numeric labels to 3, setting the color of the border of the numeric labels to be green, setting the shape of the border to be a circle.

In this step S20, the user also sets the starting numerical value of the numeric labels, the Y-partition value, the top margin between the reference and the numeric label of the reference, and the left margin between the reference and the numeric label of the reference. The top margin and the left margin of the reference determine a_location to insert the numeric label corresponding to the reference.

In step S22, the input/output module 12 reads the label properties, imports the technical drawing file to be inserted with the numeric labels. The technical drawing file is the CAD system (e.g. Pro/E, I-DEAS, Parasolid, AutoCAD, VPS, or the like) readable file that contains 2-Dimensional and/or 3-Dimensional data. In the preferred embodiment, the CAD system used is the AutoCAD system.

In step S22, the input/output module 22 checks whether the technical drawing file has the at least two references to be inserted with the numeric labels and checks whether the data of each of the references to be inserted with the numeric labels is formatted as defined by AutoCAD. In the preferred embodiment, the references refer to dimensions. For example, the technical drawing file data contains data representing a plurality of circles and rectangles, each of the circles has the diameter value, each of the rectangles has the length value and the width value, the diameter value, the length value and the width value measured are the references to be inserted with the numeric labels. The attributes of each of the references include: the x-coordinate value, the y-coordinate value and the identification N.

In step S24, the selecting module 14 extracts the references to be inserted with numeric labels from the technical drawing file according to the data of the references as defined by AutoCAD, and inputs the references into an array of references. In the array of references, each of the references has the identification N, the x-coordinate value, and the y-coordinate value.

In step S26, the input/output module 12 obtains the numeric labels configuration or creates the new numeric labels configuration if the desired configuration is not available. For example, in the preferred embodiment, the numeric labels configuration may be: setting the font size of the numeric labels to 6, setting the font of the numeric labels as times new roman, setting the color of the numeric labels to be black, setting the value of the label numerical variable to 5, setting the size of the numeric labels to 4, setting the color of the border of the numeric label to be green, setting the shape of the border to be a circle.

In step S28, the labeling module 16 automatically labels the references in the array of references with numeric labels correspondingly.

In step S30, the input/output module 12 outputs results after inserting the numeric labels.

Figure 4:
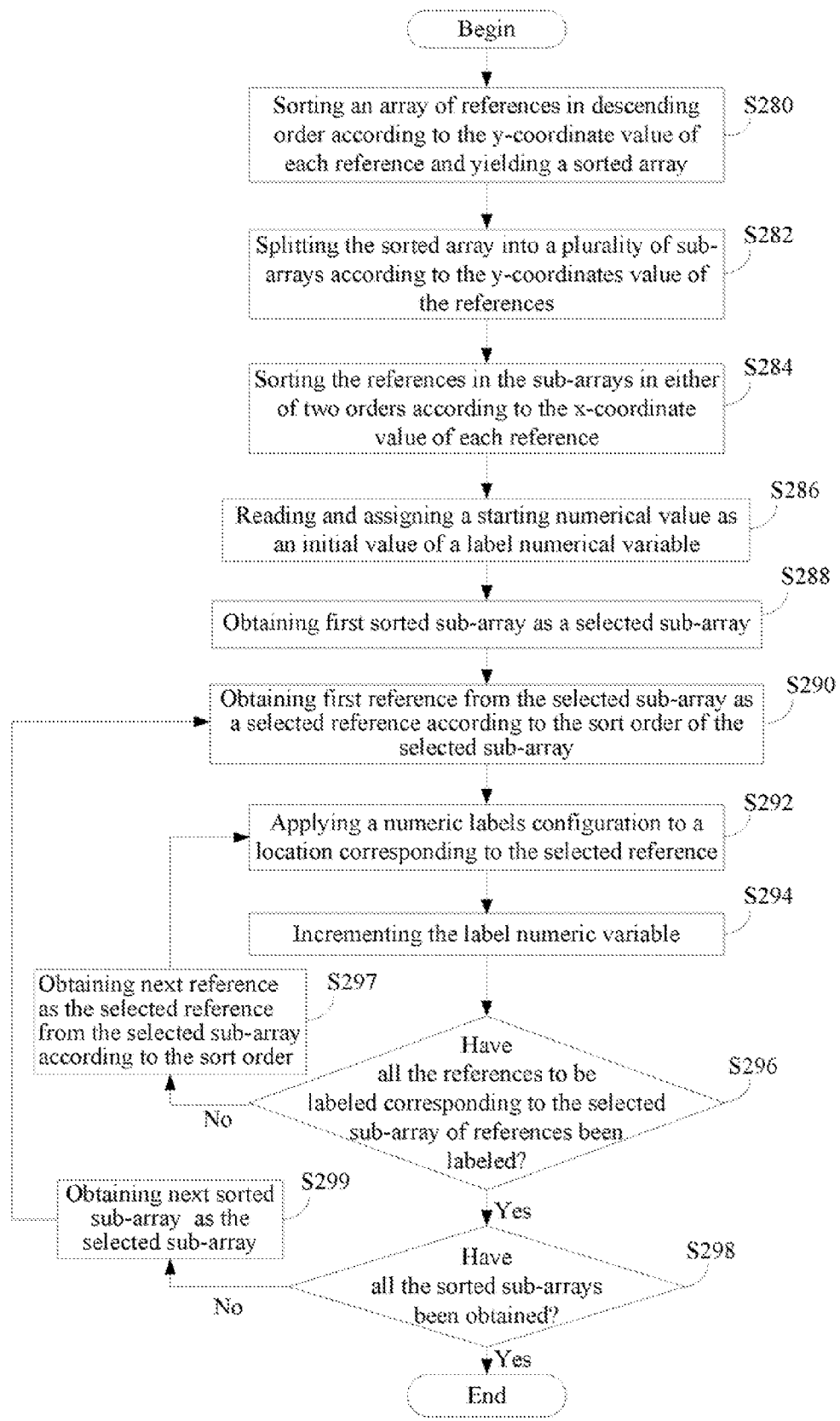
FIG. 4 is a flowchart of one step of the method of FIG. 3.

FIG. 4 is a flowchart of details of step S28 in FIG. 3. In step S280, the sorting sub-module 160 sorts the array of references in descending order according to the y-coordinate value of each reference, thereby yielding the sorted array.

In step S282, the partitioning sub-module 162 splits the sorted array into the plurality of sub-arrays according to the y-coordinates of the references. The number of sub-arrays equals to the Y-partition value. Each of the sub-arrays would represent the range of the y-coordinates. In the preferred embodiment, each of the sub-arrays would have an equal range size. Each of the sub-arrays would contain the references whose y-coordinate lies in the range represented by the sub-array correspondingly. For example, if the highest y-coordinate value of the reference in the example array is 41, the lowest y-coordinate value of the reference in the example array is 11, and the Y-partition value is 3, the partitioning sub-module 162 would split the example array into 3 sub-arrays, the first example sub-array representing the range of [31, 41], the second example sub-array representing the range of [21, 31), and the third example sub-array representing the range of [11, 21).

In step S284, the sorting sub-module 160 sorts the references in the sub-arrays in either of the first order and the second order according to the X-coordinate value of each of the references such that no two sub-arrays representing adjacent ranges have the same order. In the preferred embodiment, the first order is the ascending order and the second order is the descending order. Using the previous example, if the first example sub-array is sorted in the ascending order, then the second example sub-array is sorted in the descending order, and the third example sub-array would be sorted in the ascending order.

In step S286, the input/output module 12 reads and assigns the starting numerical value as an initial value of the label numerical variable.

In step S288, the input/output module 12 obtains the first sorted sub-array as the selected sub-array. Using the previous example, the first sorted sub-array represents the range of [31,41] and is sorted in the ascending order.

In step S290, the input/output module 12 obtains the first reference to be inserted with the numeric label from the selected sub-array as the selected reference according to the sorted order of the selected sub-array.

In step S292, the input/output module 12 applies the numeric labels configuration to the location that will be inserted with the numeric label corresponding the selected reference. The location is determined by the top margin and the left margin of the selected reference.

In step S294, the modifying sub-module 164 increments the label numerical variable automatically.

In step S296, the label detecting sub-module 166 detecting whether all the references to be inserted with the numeric labels corresponding to the selected sub-array of references have been labeled. If any references have not been labeled, the procedure goes to the step S297. Otherwise, the procedure goes to the step S298.

In step S297, the input/output module 12 obtains the next reference from the selected sub-array as the selected reference according to the sort order. Then, the procedure returns to the step S292.

In step S298, the label detecting sub-module 166 detects whether all the sorted sub-arrays have been obtained. If any sorted sub-array has not been obtained, the procedure goes to the step S299, otherwise, the procedure ends.

In step S299, the input/output module 12 obtains the next sorted sub-array as the selected array, then the procedure returns to the step S290.

In step S294 instead of incrementing the label numerical variable, the modifying sub-module 164 decrements the label numerical variable automatically in other embodiments of this invention.

It is to be understood that other embodiments may be utilized and structural changes may be made without departing from the scope of the present invention.

What is claimed is:

1. A system for inserting numeric labels automatically, the system comprising:
   a setting module configured for setting label properties of inserting numeric labels to define numeric labels configuration, and setting a top margin and a left margin of a reference to determine a location to insert the numeric label corresponding to the reference;
   an input/output module configured for reading the label properties, importing a technical drawing file to be inserted with the numeric labels, and applying the numeric labels configuration to the location to insert with the numeric label corresponding to the reference;
   a selecting module configured for extracting an array of references to be inserted with the numeric label from the technical drawing file; and
   a labeling module configured for generating a sorted array by sorting the array of references in an ascending order or a descending order, and labeling the references in the array of references with numeric labels correspondingly according to the numeric labels configuration.

2. The system of claim 1, wherein the label properties comprises: a font size of the numeric labels, a font of the numeric labels, a color of the numeric labels, a label numerical variable, a size of the numeric labels, a color of the border of the numeric label, and a figure of the border.

3. The system of claim 1, wherein each reference in the array of the references has an identification N, an x-coordinate value, and a y-coordinate value.

4. The system of claim 3, wherein the labeling module comprises:
   a sorting sub-module configured for sorting the array of references according to the y-coordinate value of each reference, and yielding a sorted array;
   a partitioning sub-module configured for splitting the sorted array of references into a plurality of sub-arrays according to the y-coordinate value of each reference and a Y-partition value;
   a modifying sub-module configured for incrementing or decrementing the label numerical variable; and
   a label detecting sub-module configured for determining whether all the references to be inserted with the numeric labels corresponding to the sub-arrays of references have been labeled.

5. The system of claim 4, wherein the sorting sub-module is further configured for sorting the references in the sub-arrays in either of the ascending order and the descending order according to the x-coordinate value of each of the references, and wherein two sub-arrays representing adjacent ranges should have different orders.

6. The system of claim 1, wherein the input/output module is further configured for outputting results after inserting the numeric labels.

7. A computer-based method for inserting numeric labels automatically, the method comprising the steps of:
   setting label properties of inserting numeric labels to define a numeric labels configuration;
   setting a top margin and a left margin of a reference to determine a location to insert the numeric label corresponding to the reference;
   reading the label properties, and importing a technical drawing file to be inserted with numeric labels;
   extracting an array of references to be inserted with numeric labels from the technical drawing file;
   generating a sorted array by sorting the array of references in an ascending order or a descending order;
   obtaining the numeric labels configuration or creating a new numeric label configuration;
   applying the numeric labels configuration to the location to insert with the numeric label corresponding to the reference; and
   labeling the references in the array of references with numeric labels correspondingly according to the numeric labels configuration.

8. The method of claim 7, further comprising the step of: outputting results after inserting the numeric labels.

9. The method of claim 7, wherein the label properties comprises: a font size of the numeric labels, a font of the numeric labels, a color of the numeric label, a label numerical variable, a size of the numeric labels, a color of the border of the numeric labels, and a shape of the border.

10. The method of claim 7, wherein each reference in the array of the references has an identification N, an x-coordinate value, and a y-coordinate value.

11. The method of claim 10, wherein the labeling step comprises the steps of:

sorting the array of references according to the y-coordinate value of each reference, and yielding a sorted array;

splitting the sorted array into a plurality of sub-arrays according to the y-coordinate value of each reference and a Y-partition value;

sorting the references in the sub-arrays in either of the ascending order and the descending order according to the x-coordinate value of each of the references and two sub-arrays representing adjacent ranges have different orders;

reading and assigning a starting numerical value as an initial value of a label numerical variable;

obtaining first sorted sub-array as a selected sub-array;

obtaining first reference as a selected reference from the selected sub-array according to the sort order of the selected sub-array;

applying the numeric labels configuration to the location to be inserted with numeric label corresponding to the selected reference;

incrementing or decrementing the label numerical variable;

obtaining next reference as the selected reference from the selected sub-array according to the sorted order in the selected sub-array, and repeating the applying step and the incrementing step until all the references are labeled in the selected sub-array; and obtaining next sorted sub-array as the selected sub-array, and repeating the obtaining first reference as a selected reference step.

* * * * *